(12) United States Patent
Das et al.

(10) Patent No.: US 7,007,380 B2
(45) Date of Patent: Mar. 7, 2006

(54) TFI PROBE I/O WRAP TEST METHOD

(75) Inventors: Gobinda Das, Hopewell Junction, NY (US); Franco Motika, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 10/707,926

(22) Filed: Jan. 26, 2004

(65) Prior Publication Data

US 2004/0124867 A1 Jul. 1, 2004

Related U.S. Application Data

(62) Division of application No. 10/035,186, filed on Jan. 4, 2002, now Pat. No. 6,731,128, and a division of application No. 09/615,198, filed on Jul. 13, 2000, now abandoned.

(51) Int. Cl.
*H01K 3/10* (2006.01)

(52) U.S. Cl. .................. 29/852; 29/407.01; 29/825; 29/846

(58) Field of Classification Search ............. 29/407.1, 29/825, 846, 852
See application file for complete search history.

(56) References Cited

U.S. PATENT DOCUMENTS

| | | |
|---|---|---|
| 3,867,693 A | 2/1975 | Saxenmeyer, Sr. |
| 4,241,307 A | 12/1980 | Hong |
| 4,967,142 A | 10/1990 | Sauerwald et al. |
| 4,968,931 A | 11/1990 | Littlebury et al. |
| 5,207,585 A | 5/1993 | Byrnes et al. |
| 5,321,277 A | 6/1994 | Sparks et al. |
| 5,390,191 A | 2/1995 | Shiono et al. |
| 5,416,409 A | 5/1995 | Hunter |
| 5,450,415 A | 9/1995 | Kamada |
| 5,491,427 A | 2/1996 | Ueno et al. |
| 5,513,430 A * | 5/1996 | Yanof et al. ............. 29/846 |
| 5,787,098 A | 7/1998 | DasGupta et al. |
| 5,852,617 A | 12/1998 | Mote, Jr. |
| 5,887,001 A | 3/1999 | Russell |
| 5,909,124 A | 6/1999 | Madine et al. |
| 5,968,191 A | 10/1999 | Thatcher et al. |
| 6,323,663 B1 | 11/2001 | Nakata et al. |
| 6,729,019 B1 * | 5/2004 | Grube et al. ............. 29/830 |

FOREIGN PATENT DOCUMENTS

JP 10115654 A 5/1998

OTHER PUBLICATIONS

W.H. McAnney, "Improving the Fault Coverage of Boundary Scan," Research Disclosure, Mar. 1991, No. 323, England.

"Contactless On–Chip AC I/O Wrap Test," Research Disclosure 41, Sep. 1998, Kenneth Mason Publications Ltd., England.

* cited by examiner

*Primary Examiner*—Carl J. Arbes
(74) *Attorney, Agent, or Firm*—Connolly Bove Lodge & Hutz LLP; Larry J. Hume; Robert Walsh, Esq.

(57) ABSTRACT

A method for testing external connections to semiconductor devices. The method includes providing an external electrical path between selected external connections on the semiconductor devices.

5 Claims, 7 Drawing Sheets

FIG. 1

Typical LSSD Configuration

FIG. 2

Typical LSSD Scan Chain

FIG. 3

FIG. 4
Typical Common I/O Configuration

FIG. 5A
Standard

FIG. 5B
Top short

FIG. 5C
Bottom short

TFI Membrane Probe Configurations

FIG. 5D
Starting Material

FIG. 6A
Laser Ablate
Blind Vias

FIG. 6B
Electroplate Copper
in Vias

FIG. 6C
Etch Pads
in Copper

Standard TFI Probe Build Process

FIG. 7A Typical TFI Probe

FIG. 7B TFI Probe with Shorted Pair

TFI PROBE I/O WRAP TEST METHOD

CROSS REFERENCE TO RELATED APPLICATIONS

This Application is a Division of application Ser. No. 10/035,186 now U.S. Pat. No. 6,731,128 filed on Jan. 4, 2002, and application Ser. No. 10/035,186 is a Division of application Ser. No. 09/615,198, filed on Jul. 13, 2000, now abandoned, the entire contents of each of which is incorporated herein by reference.

FIELD OF THE INVENTION

The present invention relates to a structure and method for testing external connections on semiconductor devices. The present invention also relates to a method for forming a structure for testing external connections on semiconductor devices.

BACKGROUND OF THE INVENTION

Semiconductor device manufacturing involves many process and testing steps. This testing often includes testing the functioning of elements of the semiconductor devices as well as the integrity of the structure making up the connections and elements. Typically, the testing is carried out by contacting connections on the semiconductor devices with one or more testing apparatuses. A testing apparatus is usually connected to the connections.

SUMMARY OF THE INVENTION

The present invention provides a structure for testing external connections to semiconductor devices. The structure includes an external electrical path between selected pairs of external connections on the semiconductor devices.

Additionally, the present invention provides a method for testing external connections to a semiconductor device. The method includes providing an external electrical path between selected pairs of external connections on the semiconductor devices. Testing is then carried out by sending at least one signal through the external electrical path.

Furthermore, the present invention provides a method for forming a structure for testing external connections to semiconductor devices. The method includes providing a thin film of electrically insulating material. A plurality of passages are provided through the thin film of electrically insulating material. The passages are arranged in a pattern corresponding to a pattern of external connections on the semiconductor device. Electrically conducting material is provided in the plurality of passages. Electrical connections are provided between the electrically conducting material in selected pairs of the plurality of passages.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

One technique used for testing semiconductor devices is the Level Sensitive Scan Design (LSSD) scan based design concepts and the reduced-pin-count test methodology. LSSD techniques include I/O boundary scan test and I/O wrap test concepts that are practiced on chips and system designs. The concepts of LSSD can apply to other variations of boundary scan designs as well.

The scan design methodology provides a system design and a Design-for-Test (DFT) approach that incorporates several basic test concepts. According to scan design techniques, most of a device's storage elements, such as latches or registers, are contacted in one or more scan chains and can be externally accessed via one or more serial inputs and outputs. Storage elements that are not in this category typically include memory or other special macros that may be isolated and tested independently.

Furthermore, scan design methodology can help to ensure that all logic feedback paths are gated by one or more of these storage elements, thereby simplifying a sequential design into subsets of combinational logic sections.

Figure 1:
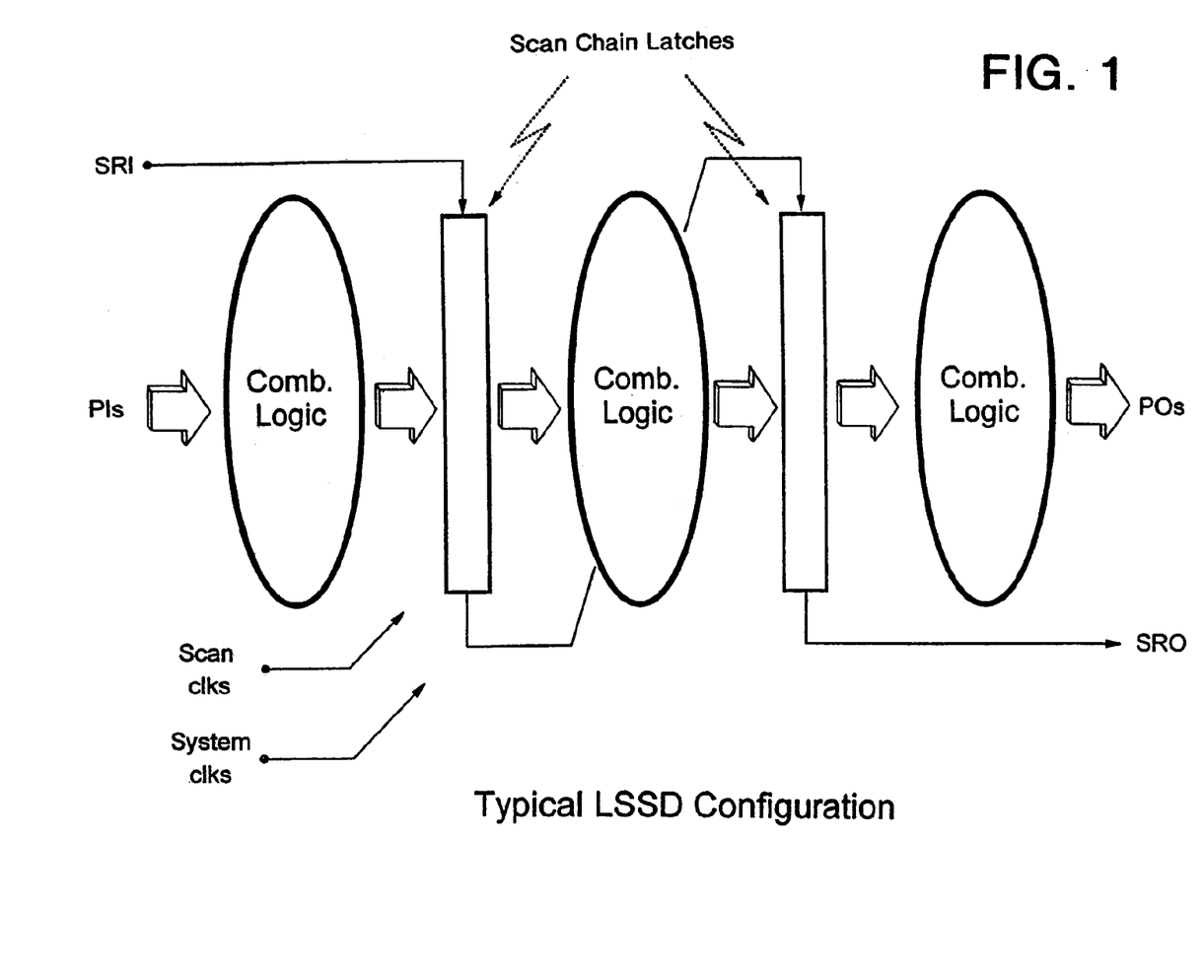
FIG. 1 represents a schematic representation of a known configuration for carrying out structural or functional testing of semiconductor devices.
Figure 2:
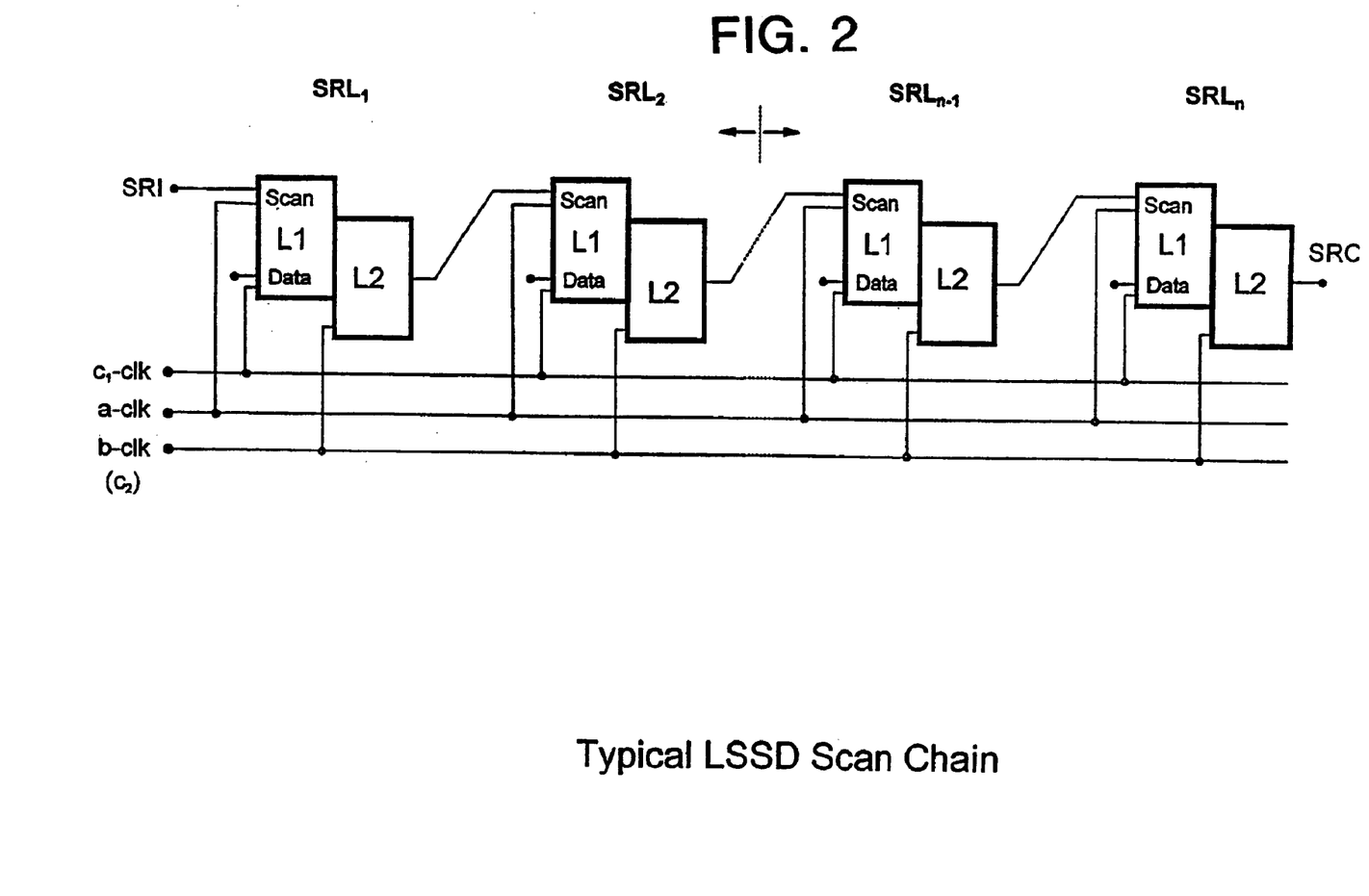
FIG. 2 represents a schematic representation of a known scan design configuration of electrical connections for carrying out testing of semiconductor devices.

FIGS. 1 and 2 illustrate, respectively, a typical LSSD configuration and scan chain. As can be seen in FIG. 1, a primary input (PI) is supplied to a series of combinational logic with scan chain latches therebetween. Scan register input (SRI) supplies input to the scan chain latches. Scan clocks and system clocks help control the operation. The scan chain latches produce a scan register output, while the combinational logic produces a primary output (PO).

FIG. 2 illustrates a plurality of shift register latches ($SRL_1$, $SRL_2$ . . . $SRL_{n-1}$, $SRL_n$). Each SRL includes a master latch L1 and a slave latch L2. The slave latch of an SRL is connected to the master latch of the succeeding SRL. Each SRL is connected to can clocks, a-clk and b-clk, and system clocks, $c_1$-clk and $c_2$-clk. Scan register input (SRI) is supplied to $SRL_1$ and scan register output (SRO) is output from $SRL_n$.

The basic design concepts of scan design in conjunction with the associated system and scan clocking sequences greatly simplify the test generation, testing, and diagnosability of very complex logic structures. Every latch can be used as a pseudo Primary Input (PI) and as a pseudo Primary Output (PO) in addition to the regular primary inputs and primary outputs to enhance the stimulation and observability of the device being tested or diagnosed.

The I/O boundary scan test methodology allows complete internal functional or structural testing of logic devices at all packaging levels using testers with fewer pins than the product number of I/Os. This test technique, also referred to as reduced pin count testing, is especially useful and cost effective at wafer level testing, wherein probing large numbers of I/Os quickly becomes impractical. In this reduced pin count test technique, a small number, for example, 64 I/Os, of test control PIs and POs may be used to interface to the device and execute all internal tests.

The boundary scan latches are used as pseudo PIs and POs stimulation and observation points, instead of the associated external PIs and POs. This allows for full testing of the device internal circuitry via the scan chains and small subset of control PIs and POs without the need for the tester to contact the "External" I/Os In addition to the internal logic, one must address the testing of the circuits associated with these external I/Os that are between the boundary latches and the I/O pads, such as the driver receiver, supporting enable and disable logic, and the I/O pad or C4 chip external connection.

Figure 3:
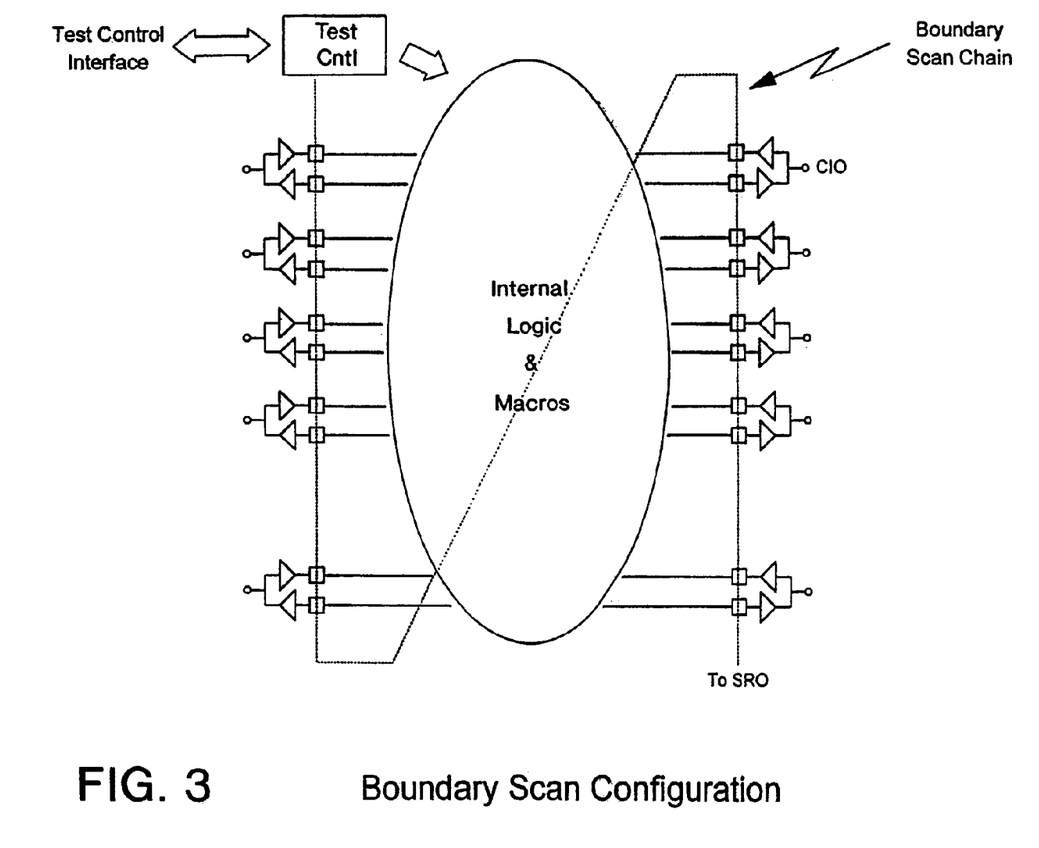
FIG. 3 represents a schematic representation of a known configuration for carrying out boundary scan testing.
Figure 4:
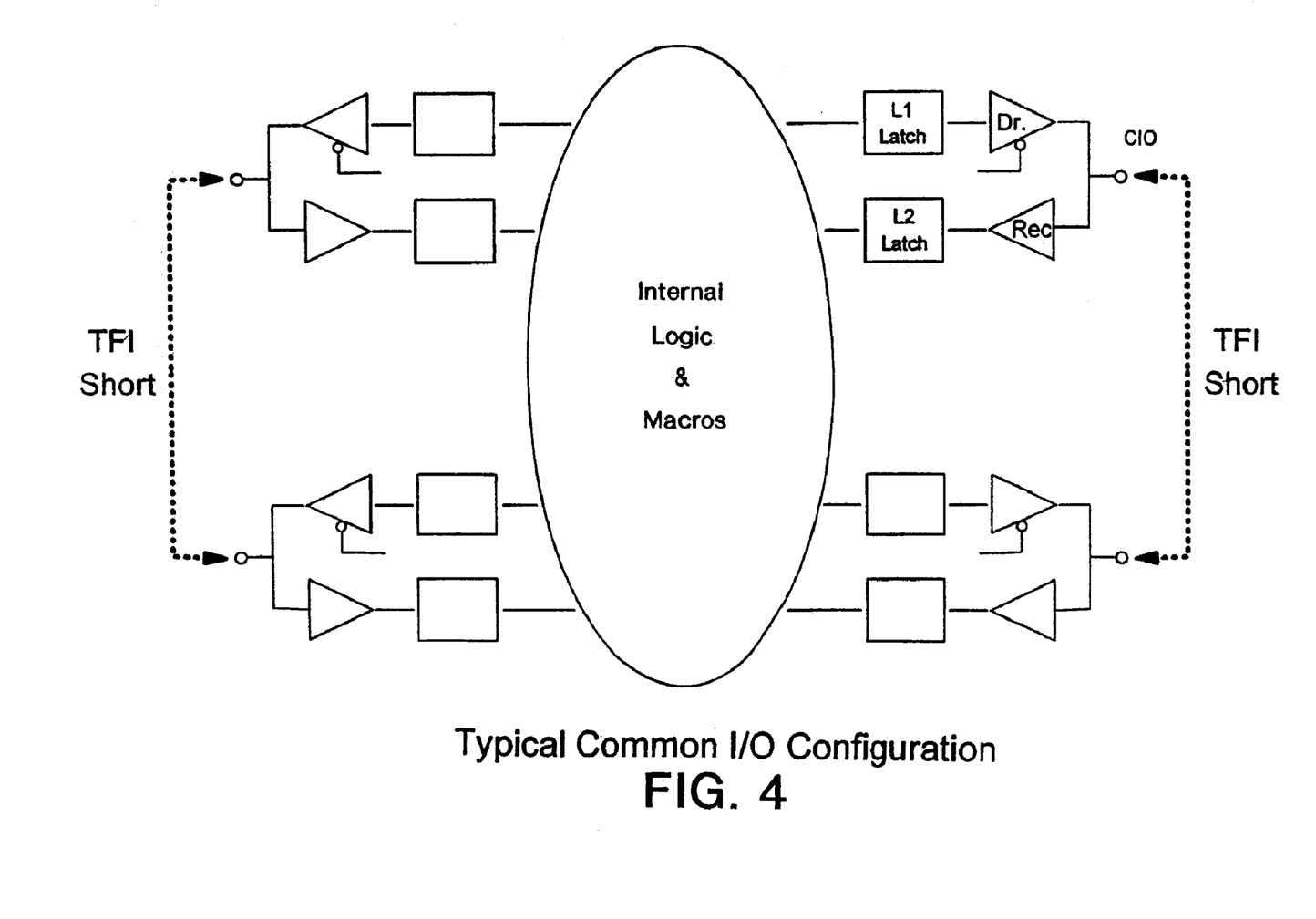
FIG. 4 represents a schematic representation of a known configuration of inputs/outputs for carrying out a boundary scan.

An effective method to test most of this external-to-boundary-scan circuitry is the I/O Wrap Test technique. This technique is based on the design that insures all the PIs/POs are configured as common input/outputs (CIOs) and provides for an alternate test mode setup that allows the boundary scan latches to be used to launch a stimulus to the CIO driver and capture the responses into the corresponding I/O's boundary scan latch. FIGS. 3 and 4 illustrate a boundary scan configuration and typical I/O configuration, respectively. With some basic test generation algorithms simple high test coverage patterns can be generated for most of the driver/receiver and associated control circuitry.

Of course, what the above reduced pin count test techniques do not provide is a way to test the specific circuitry to the external pad, support proper loading of the driver under test, or the ability to check minimum and maximum driver and receiver analog levels. These tests are usually performed at the final package level with a full I/O contact test system.

It is within this "I/O wrap" method and "reduced-pin-count" testing of CIOs without a tester channel contacting each external product pad that the problems described above are encountered.

The problem of testing C4 pads at the wafer level can be solved by utilizing a structure according to the present invention by fully contacting each I/O with a test system that has a full complement of tester channels. This is usually a very expensive system when the pin count is in the thousands of I/Os.

The present invention provides a solution to testing paths between internal drivers/receivers and external I/O contact pads or C4s. In doing so, the basic concept of the present invention includes providing an external electrical path between pairs of "external" connections on semiconductor devices.

The present invention can use these connections in conjunction with boundary scan and I/O wrap test techniques. The external path can be realized by modifying a Thin Film Interposer (TFI) probe design to ensure continuity between corresponding pairs of probes. This can permit a driver from an I/O to interface to the receiver of the corresponding paired I/O and test the full path, including the two external C4s as shown in FIG. 4.

A particularly favorable implementation of the concept of the present invention could be achieved when pairing all adjacent I/Os. This is especially desirable for area array C4 interconnections where the number of I/O and power contacts is very large, for example, in the thousands. Proper I/O and power C4 layout early in the design phase of the chip can accommodate and optimize adjacent pairing requirements.

Once the external C4 pair path is established, testing is accomplished in a similar manner to the internal I/O wrap test as shown in FIGS. 3 and 4. However, instead of using the CIO driver-receiver to close the test loop, the paired driver-receiver could be utilized and the same test sequence applied. Of course, in the case of CIOs, the driver typically would have the capability to be tri-stated or disabled to avoid orthogonality concerns.

The concept of the present invention is also applicable to buckling beam probing technologies by implementing the external paired I/O on the space transformer instead of on the TFI. This may be a less desirable approach since the cost of space transformers is significantly higher, for example, Multi Layer Ceramic (MLC), and some of the electrical characteristics may not be as good.

Modification to the TFI, see U.S. Pat. No. 5,207,585, issued May 4, 1993, to Byrnes et al., for Thin Interface Pellicle for Dense Arrays of Electrical Interconnects, the entire contents of the disclosure of which is hereby incorporated by reference, process to introduce the paired short may be relatively simple and can be implemented in several ways. The short metallurgy can be on either side of the probe bumps. FIGS. 5a, 5b, 5c, and 5d depict process steps that may be utilized in forming a standard thin film interface. These process steps may be utilized to form a thin film interface structure according to the present invention as well, although with modifications.

Figure 5A:
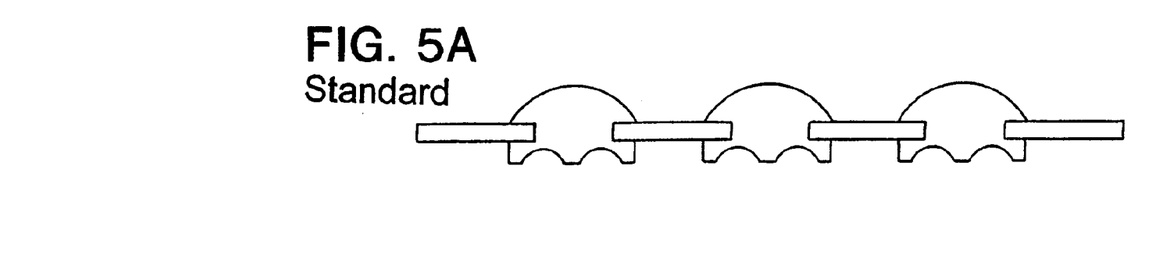
FIGS. 5a–5d represent cross-sectional views of an embodiment of a known thin film interposer (TFI) probe structure for carrying out testing of semiconductor devices at various stages of an embodiment of a process for forming the structure.
Figure 5B:
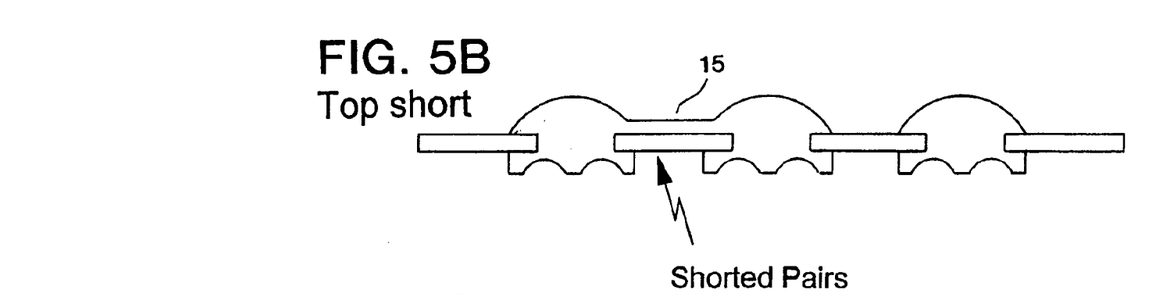
Figure 5C:
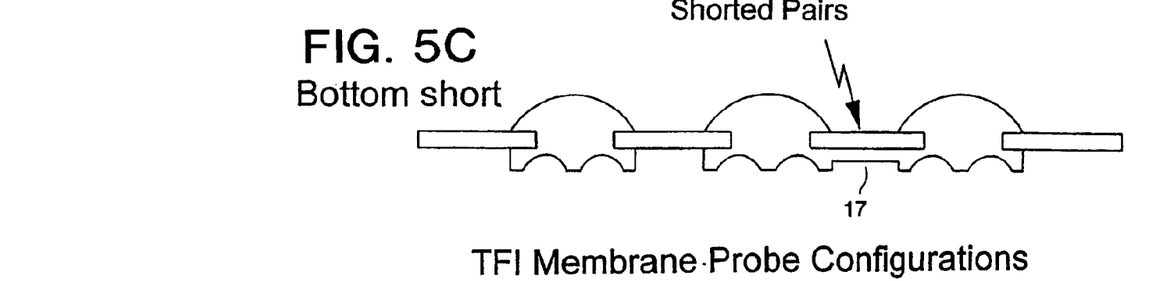
Figures 5D, 6A:
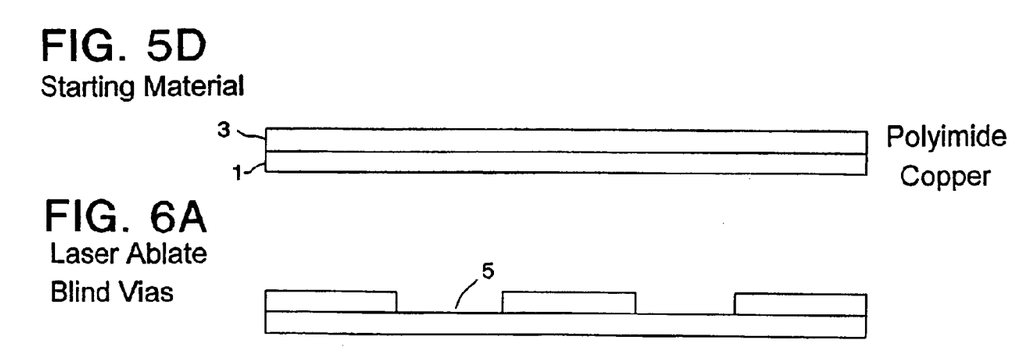
FIG. 6a represents a cross-sectional view of an embodiment of a known TFI probe structure for carrying out testing of semiconductor devices.

As illustrated in FIG. 5d, layers of electrically conducting material 1 and electrically insulating material 3 may be provided attached to each other. Any electrically conducting and electrically insulating materials may be utilized. For example, the electrically conducting material could be a metal. According to one particular example, the metal is copper and the electrically insulating material is a polyimide.

The thickness of the electrically conducting material may be about 1 mil to about 3 mils. On the other hand, the thickness of the electrically insulating material may be about 1 mil to about 4 mils.

Blind vias 5 may be formed through the layer of electrically insulating material. Any suitable technique may be utilized to form the blind vias. According to one example, the blind vias are formed by laser ablation of the electrically insulating material through a moly mask. Standard photolithographic techniques could also be utilized to form the blind vias.

The blind vias typically are formed in a pattern that corresponds to the pattern of external connections on a semiconductor device that is to be engaged by the structure. It in not necessary that a blind via be produced at every location where an external connection exists.

After forming blind vias in the layer of electrically insulating material, electrically conducting material may be deposited in the blind vias in the form of bumps. The electrically conducting material may extend over the surface of the layer of electrically insulating material as shown in FIG. 5c.

Any suitable electrically conducting material could be utilized. For example, the electrically conducting material could be a metal. According to one particular example, copper is utilized as the electrically conducting material deposited in the blind vias.

The electrically conducting material could be deposited utilizing any suitable techniques. According to one example, electroplating is utilized.

Other electrically conducting materials could also be deposited over the electrically conducting material deposited in the shape of bumps in the blind vias. Other materials, typically referred to as "profee metallurgy" that could extend over the surface of the layer of electrically conducting material and bumps. Many electrically conducting materials could be utilized as the other material. According to one example, a layer of nickel and a layer of gold are deposited over the electrically conducting material deposited in the blind vias.

After providing electrically conducting material in the blind vias, the layer of electrically conducting material 1 may be etched to form sculpted contacts 11 opposite the blind vias. Standard photolithographic techniques may be utilized to etch the sculpted contacts 11 in the layer of electrically conducting material. The sculpted contacts 11 may include indentations 13 for providing a shoulder 14 facilitating engagement of the external contacts on a semiconductor device.

As with the electrically conducting material in the blind vias, another electrically conducting and protective material may be deposited on the sculpted contacts 11, indentations 13, and shoulders 14 provided in the layer of electrically conducting material. Any electrically conducting material could be deposited over the sculpted contacts 11, indentations 13, and shoulders 14. According to one example, a layer of nickel and a layer of gold are deposited over the pads 11.

The structure may then be further processed according to the present invention. Along these lines, FIG. 6a illustrates a known TFI structure. The structure shown in FIG. 6a may be further processed to provide connections between selected pairs or a subset of more than two pads of the pads. The connections, or shorts, between the pads may be formed on either side of the layer of electrically insulating material. Along these lines, the short(s) may be formed on the top 15 of the layer of electrically conducting material, as shown in FIG. 6b, or on the bottom 17 of the layer of electrically conducting material, as shown in FIG. 6c.

The shorts represent external electrical paths between selected pairs of external connections on a semiconductor device. External paths may be provided between any number of pairs of external connections. Along these lines, all adjacent input/output pairs of external connections on a semiconductor device may be paired.

Any suitable method may be utilized for forming the shorts. Along these lines, the shorts may be etched in the layer of electrically conducting material at the same time that the sculpted contacts 11, indentations 13, and shoulders 14 are formed, where the shorts are at the bottom of the layer of electrically insulating material. Alternatively, electrically conducting material could be deposited on the top or bottom of the layer of electrically insulating material, as shown in FIGS. 6b and 6c, respectively.

Figure 6B:
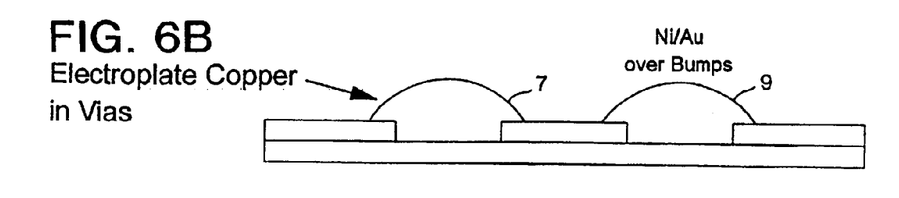
FIGS. 6b and 6c represent cross-sectional views of two embodiments of a TFI probe structure according to the present invention for carrying out testing of semiconductor devices.
Figure 6C:
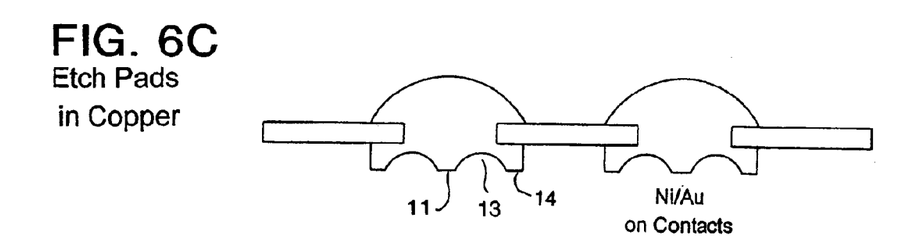
Figure 7A:
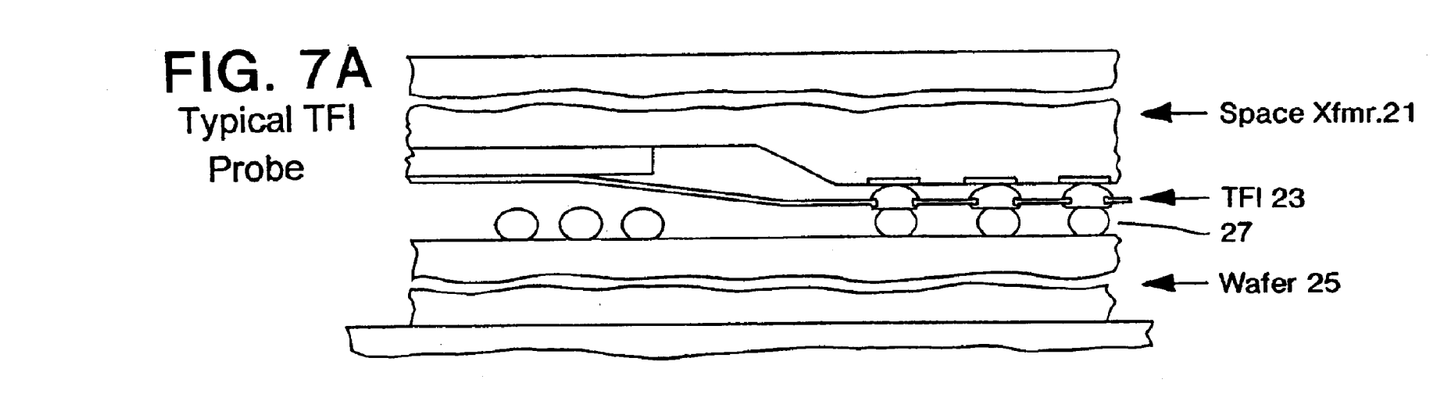
FIG. 7a represents a cross-sectional view of an embodiment of a known structure for carrying out testing of semiconductor devices.
Figure 7B:
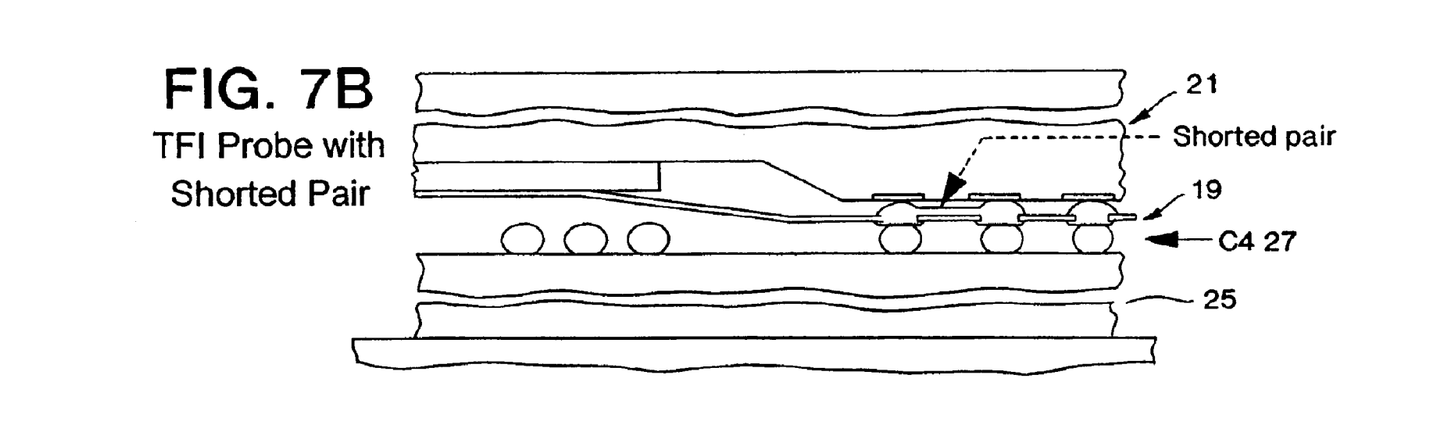
FIG. 7b represents a cross-sectional view of an embodiment of a structure according to the present invention for carrying out testing of semiconductor devices.

After forming a TFI structure as shown in FIGS. 6b and 6c, the structure 19 may be assembled to a space transformer 21 as shown in FIG. 7b. FIG. 7a depicts an entire probing assembly including a known TFI structure 23. The structures illustrated in FIGS. 7a and 7b are joined to semiconductor wafers 25 that include C4 connections 27.

The present invention also provides a method for testing external connections to a semiconductor device. The method includes providing an external electrical path between selected pairs of or a subset of more than two external connections on the semiconductor device. The external electrical path may be provided with a structure such as that described herein.

After providing the electrical connection, the testing may be carried out by sending at least one signal through the electrical connection. The testing may include any one or more of the tests described herein or any other test.

Furthermore, the present invention provides a method for forming a structure for testing external connections to semiconductor devices, such as that described herein.

In addition to the external I/O wrap test described above, the concept of the present invention can be extended to several other wafer test methodologies. For example, the concept can be used in a full wafer contact environment. This may be encountered in wafer-level self test or wafer-level burn-in. In both cases, multiple or all the chips on a wafer may be contacted simultaneously and tested. The DFI probe can be used in this context to distribute power and signals on the entire wafer.

Another extension of the concept of the present invention may be encountered when testing very high frequency device I/Os. In this case, the device or chip typically needs to be tested at wafer level or prior to final packaging. Self-test or BIST can usually verify the functionality of the internal circuitry, but the I/O interface testing is usually limited by the contacting fixture and the associated cabling to the test system. This can be alleviated by extending BIST to test the I/Os via the shorted pair concept, while maintaining an extremely high frequency closed loop environment and better power distribution.

Multiple sets of non-adjacent pads could also be shorted together. Additionally, more than a pair of pads could be shorted together. Reference to a pad herein includes the sculpted contacts 11, indentations 13, and shoulders 14 that can make up the finished pads.

The present invention provides a superior structure and method as compared to known structures and methods because the present invention provides an efficient and unique solution to full I/O testing at the early wafer level screen. The advantages and benefits of the present invention include extending I/O wrap tests to C4. Additionally, the present invention permits lower power distribution contact resistance and inductance.

Also, the present invention may eliminate the need for full "external" I/O testing. Furthermore, the present invention can eliminate the need for all external I/Os to be "test-only" CIOs. The present invention also permits high frequency closed loop self test of drivers and receivers. Still further, the present invention is extendible to full wafer contacting for burn-in and test. Significantly, the present invention provides a structure that is compatible with present contacting and test methodologies. The present invention also complements known built-in self test (BIST) engine designs.

The present invention provides a general solution to I/O testing. Along these lines, the concept of the present invention can be broadly applied. For example, both in chip design and semiconductor manufacture, utilization of the present invention in one of several scan design and test methodologies can greatly improve process yields and product time to market. In particular, the present invention would be especially useful for high pin count designs using area array C4 contacting technology and requiring Known Good Die (KGD) product qualities.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for forming a structure for testing external connections to semiconductor devices, the method comprising:

providing a thin film of electrically insulating material;

providing a plurality of passages through the thin film of electrically insulating material, wherein the passages are arranged in a pattern corresponding to a pattern of external connections on the semiconductor device;

providing electrically conducting material in the plurality of passages; and providing electrical connections between the electrically conducting material in selected passages.

2. The method according to claim 1, wherein providing the electrical connections between the electrically conducting material in the selected passages comprises providing electrically conducting material on the thin film of electrically insulating material between the selected passages.

3. The method according to claim 1, wherein the selected passages are adjacent pairs.

4. The method according to claim 1, wherein the electrical connections are provided between a plurality of passages.

5. The method according to claim 1, wherein the electrical connections are provided between non-adjacent passages.

* * * * *